United States Patent
Li et al.

(10) Patent No.: US 10,741,654 B2
(45) Date of Patent: Aug. 11, 2020

(54) SEMICONDUCTOR DEVICE AND FORMING METHOD THEREOF

(71) Applicant: TAIWAN SEMICONDUCTOR MANUFACTURING CO., LTD., Hsinchu (TW)

(72) Inventors: Chung-Ting Li, Hsinchu County (TW); Jen-Hsiang Lu, Taipei (TW); Chih-Hao Chang, Chubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/353,922

(22) Filed: Nov. 17, 2016

(65) Prior Publication Data

US 2018/0138280 A1 May 17, 2018

(51) Int. Cl.
*H01L 29/417* (2006.01)
*H01L 29/66* (2006.01)
*H01L 29/78* (2006.01)
*H01L 29/49* (2006.01)
*H01L 29/165* (2006.01)

(52) U.S. Cl.
CPC .. *H01L 29/41775* (2013.01); *H01L 29/41791* (2013.01); *H01L 29/4991* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/785* (2013.01); *H01L 29/7848* (2013.01); *H01L 29/165* (2013.01)

(58) Field of Classification Search
CPC ............ H01L 21/28247; H01L 21/768; H01L 29/41775; H01L 29/6656; H01L 29/6659; H01L 29/6653; H01L 29/66795; H01L 29/41791; H01L 21/7682; H01L 23/53295; H01L 23/5226
See application file for complete search history.

(56) References Cited

U.S. PATENT DOCUMENTS

| | | | | |
|---|---|---|---|---|
| 5,715,182 A * | 2/1998 | Asai | ....................... | G01N 15/14 356/441 |
| 5,770,507 A * | 6/1998 | Chen | .................... | H01L 29/4933 257/E21.438 |
| 6,001,695 A * | 12/1999 | Wu | ...................... | H01L 29/4983 257/340 |
| 6,190,996 B1 * | 2/2001 | Mouli | ................... | H01L 21/764 257/522 |
| 6,468,877 B1 * | 10/2002 | Pradeep | ................ | H01L 21/764 257/E21.573 |
| 8,487,378 B2 | 7/2013 | Goto et al. | | |
| 8,729,634 B2 | 5/2014 | Shen et al. | | |

(Continued)

*Primary Examiner* — Dale E Page
*Assistant Examiner* — Quovaunda Jefferson
(74) *Attorney, Agent, or Firm* — McClure, Qualey & Rodack, LLP

(57) ABSTRACT

A semiconductor device includes a semiconductor substrate, at least one gate stack, a gate spacer and a dielectric cap. The gate stack is located on the semiconductor substrate. The gate spacer is located on a sidewall of the gate stack. The gate spacer includes a first dielectric layer and a second dielectric layer with different etch properties. The dielectric cap at least caps the gate spacer. The dielectric cap and the second dielectric layer define a gap therebetween.

20 Claims, 7 Drawing Sheets

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 9,379,004 B1 * | 6/2016 | Kwon .................. H01L 27/1052 |
| 2007/0184615 A1 * | 8/2007 | Brazzelli ............... H01L 21/764 |
| | | 438/266 |
| 2008/0185722 A1 * | 8/2008 | Liu ..................... H01L 21/7682 |
| | | 257/751 |
| 2008/0254579 A1 * | 10/2008 | Chi ....................... H01L 29/665 |
| | | 438/199 |
| 2010/0155790 A1 * | 6/2010 | Lin ................... H01L 21/28255 |
| | | 257/288 |
| 2013/0248950 A1 * | 9/2013 | Kang ...................... H01L 29/78 |
| | | 257/751 |
| 2013/0320457 A1 * | 12/2013 | Lim ..................... H01L 27/092 |
| | | 257/369 |
| 2013/0320550 A1 * | 12/2013 | Kim ................. H01L 21/76897 |
| | | 257/773 |
| 2014/0282326 A1 | 9/2014 | Chen et al. |

* cited by examiner

SEMICONDUCTOR DEVICE AND FORMING METHOD THEREOF

BACKGROUND

In the race to improve transistor performance as well as reduce the size of transistors, transistors have been developed such that the channel and source/drain regions are located in a fin on a bulk substrate. Such non-planar devices can be referred to as multiple-gate finFETs. A multiple-gate finFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
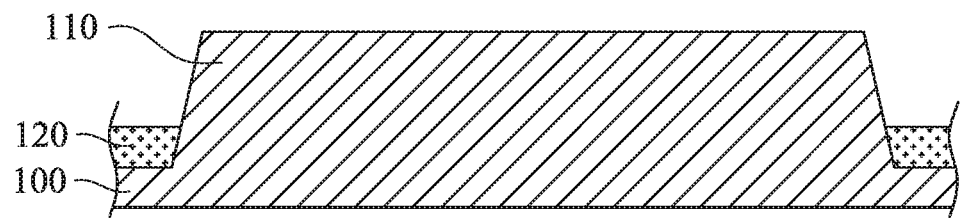
FIG. 1 to FIG. 15 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present disclosure are semiconductor devices. Such a device, for example, is a Fin field effect transistor (FinFET) device. The following disclosure will continue with a FinFET example to illustrate various embodiments. It is understood, however, that the disclosure is not limited to a particular type of device.

FIG. 1 to FIG. 15 are cross-sectional views of a method for manufacturing a semiconductor device at various stages in accordance with some embodiments of the present disclosure. Reference is made to FIG. 1. A semiconductor fin 110 is formed on the substrate 100 and protrudes from the substrate 100. In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 100 may include a semiconductor-on-insulator (SOI) structure. Also alternatively, the substrate 100 may include a buried dielectric layer, such as a buried oxide (BOX) layer, such as that formed by separation by implantation of oxygen (SIMOX) technology, wafer bonding, SEG, or other appropriate method.

In some embodiments, the semiconductor fin 110 includes silicon. The semiconductor fin 110 may be formed, for example, by patterning and etching the substrate 100 using photolithography techniques. In some embodiments, a layer of photoresist material (not shown) is sequentially deposited over the substrate 100. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 as shallow trench isolation (STI). The isolation dielectric 120 may include any suitable dielectric material, such as silicon oxide. The method of forming the isolation dielectric 120 may include depositing an isolation dielectric 120 on the substrate 100 to cover the semiconductor fin 110, optionally performing a planarization process, such as a chemical mechanical polishing (CMP) process, to remove the excess isolation dielectric 120 outside the trenches, and then performing an etching process on the isolation dielectric 120 until upper portions of the semiconductor fins 110 are exposed. In some embodiments, the etching process performed may be a wet etching process, for example, by dipping the substrate 100 in hydrofluoric acid (HF). In alternative embodiments, the etching process may be a dry etching process, for example, the dry etching process may be performed using $CHF_3$ or $BF_3$ as etching gases.

Figure 2:
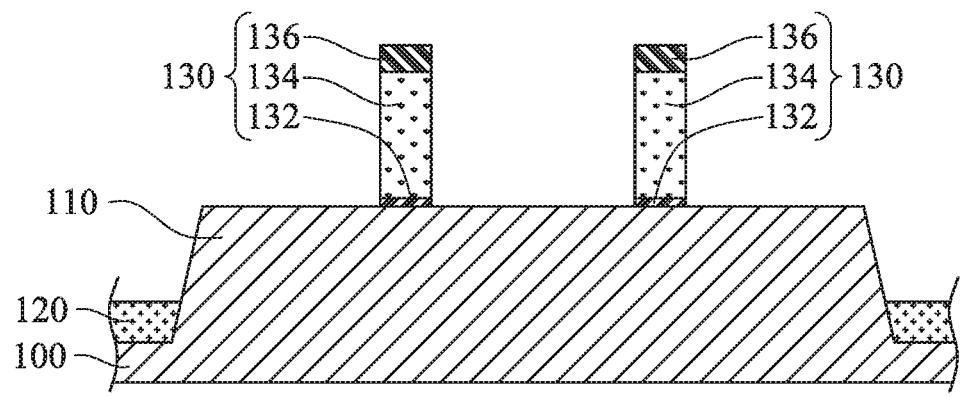

Reference is made to FIG. 2. Gate stacks 130 are formed on portions of the semiconductor fin 110 at interval and expose other portions of the semiconductor fin 110. In some embodiments using a gate-last process, the gate stacks 130 are dummy gates and at least portions thereof will be replaced by final gate stacks at a subsequent stage. For example, portions of the dummy gate stacks 130 are to be replaced later by metal gate electrodes (MG) after high temperature thermal processes, such as thermal annealing for source/drain activation during the sources/drains formation. In some embodiments, the dummy gate stacks 130 include gate dielectrics 132, dummy electrodes 134 and gate masks 136. In some embodiments, the gate dielectrics 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectrics 132 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectrics 132 may have a multilayer structure such as one layer of silicon oxide (e.g., interfacial layer) and another layer of high-k material. The dummy electrodes 134 may include polycrystalline silicon (polysilicon), as examples. The gate masks 136 may include a suitable dielectric material, such as silicon nitride, silicon oxynitride or silicon carbide, as examples.

The dummy gate stacks 130 can be formed by deposition and patterning. For example, the gate dielectric 132 is blanket deposited on the structure shown in FIG. 1 by a suitable technique, such as chemical vapor deposition (CVD). The dummy electrode 134 is deposited on the gate dielectric 132 by a suitable technique, such as CVD. The gate mask 136 is deposited on the dummy electrode 134 by a suitable technique, such as CVD. Then the gate mask 136 is patterned by a lithography process and an etching process, thereby forming openings in the gate mask 136, exposing the underlying dummy gate materials within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dummy gate materials through the openings of the gate mask 136 using the gate mask 136 as an etch mask, thereby forming the gate stacks 130 straddling portions of the semiconductor fin 110.

Figure 3:
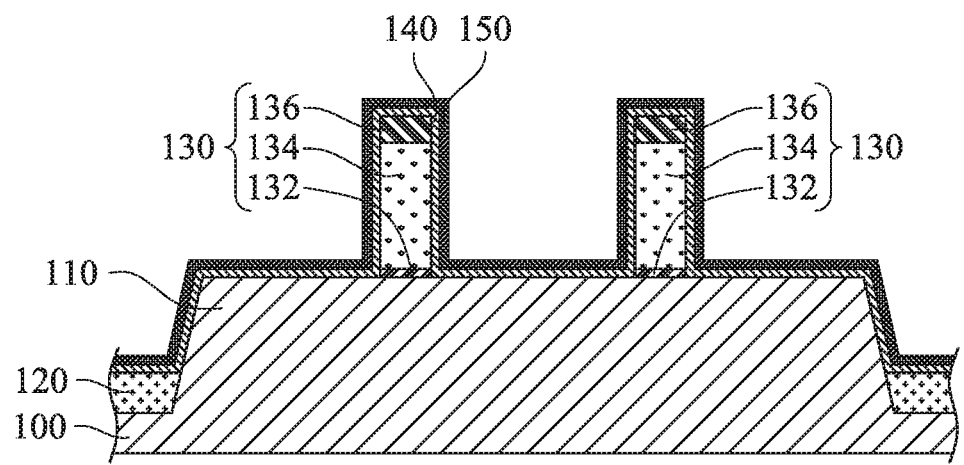

Reference is made to FIG. 3. A blanket first dielectric layer 140 is formed on the structure shown in FIG. 2. That is, the first dielectric layer 140 is conformally formed over at least the semiconductor fin 110 and the dummy gate stacks 130. In some embodiments, the first dielectric layer 140 may include silicon oxide, silicon nitride, silicon oxy-nitride, or other suitable material. In some embodiments, the first dielectric layer 140 includes non-porous dielectric materials, which may be advantageous to resist against subsequent etching processes, such as etching in a gate replacement process. The first dielectric layer 140 may be formed by a deposition process, such as an atomic layer deposition (ALD) process, a CVD process, a physical vapor deposition (PVD) process, a sputter deposition process or other suitable techniques.

Next, a second dielectric layer 150 is formed on the first dielectric layer 140, and the second dielectric layer 150 is conformal to the first dielectric layer 140. The second dielectric layer 150 has a dielectric constant less than that of the first dielectric layer 140. For example, the second dielectric layer 150 may include a low-k dielectric material having a dielectric constant less than about 4.0. In some embodiments, the dielectric constant of the second dielectric layer 150 may range from about 3.0 to about 3.9, and the dielectric constant of the first dielectric layer 140 may be greater than about 4.0, such as in a range from about 4.5 to about 6.5. The second dielectric layer 150 including the low-k dielectric material may be deposited using ALD, PVD or a CVD method such as plasma enhanced CVD (PECVD), low pressure CVD (LPCVD), or atomic layer CVD (ALCVD). In some embodiments, the second dielectric layer 150 may include porous low-k carbon-containing materials such as, for example, porous silicon oxycarbonitride (SiOCN), porous silicon oxycarbide (SiOC), porous silicon carbide (SiC), or other suitable porous dielectric materials. The porous low-k dielectric materials may be beneficial to reduce a parasitic capacitance between a metal gate stack and a contact plug formed in subsequently steps due to its porosity, and a resistive-capacitive (RC) time delay caused by the parasitic capacitance can be thus decreased. Moreover, the porous low-k dielectric layer 150 and the first dielectric layer 140 have different etch properties. For example, the first and second dielectric layers 140 and 150 have different etch resistance properties. That is, the first dielectric layer 140 is made of a material which has higher etch resistance to an etchant used to etch the second dielectric layer 150. Therefore, a portion of the porous low-k dielectric layer 150 can be selectively etched to create a gap adjacent to the first dielectric layer 140 in a subsequently process, and the gap may have an extremely low dielectric constant due to gas, especially air, contained therein. The parasitic capacitance can be further reduced, and the RC time delay can be further decreased, accordingly.

In some embodiments, the second dielectric layer 150 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, Parylene, BCB (bis-benzocyclobutenes), SiLK (Dow Chemical of Midland, Mich.), other suitable low-k dielectric materials, and/or combinations thereof.

Figure 4:
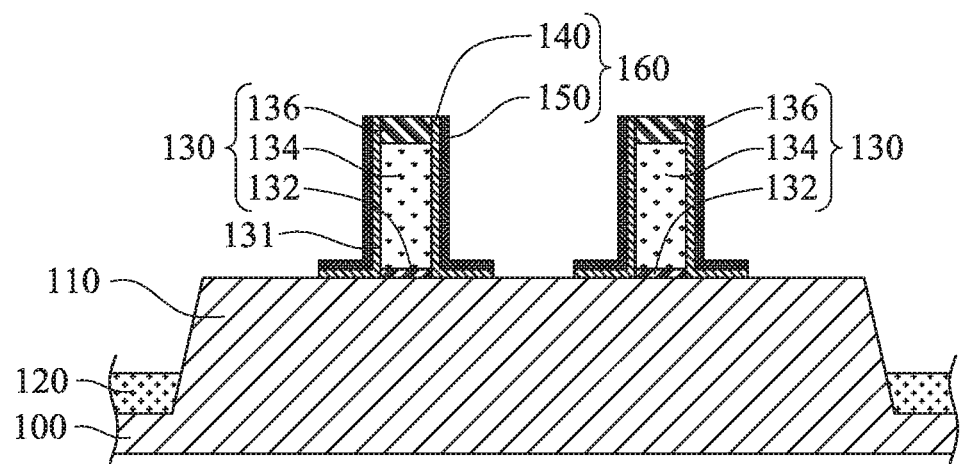

Reference is made to FIG. 4. A removal process is performed to remove portions of the first and second dielectric layers 140 and 150, and remaining portions of the first and second dielectric layers 140 and 150 can collectively serve as gate spacers 160 located on opposite sides of the dummy gate stacks 130. That is, two gate spacers 160 are respectively located on two opposite sidewalls 131 of a dummy gate stack 130. The removal process may be, for example, an etching process, such as an anisotropic etching process. In some embodiments, the gate spacer 160 has the non-porous first dielectric layer 140 located between the porous second dielectric layer 150 and the dummy gate stack 130, and therefore, the gate spacer 160 can be capable of resisting against the etching in the gate replacement process. In some embodiments, the gate spacers 160 may be used to offset subsequently formed epitaxy structures on the semiconductor fin 110, such as source/drain epitaxy structures. The gate spacers 160 may further be used for designing or modifying source/drain regions (junction) profile.

Figure 5:
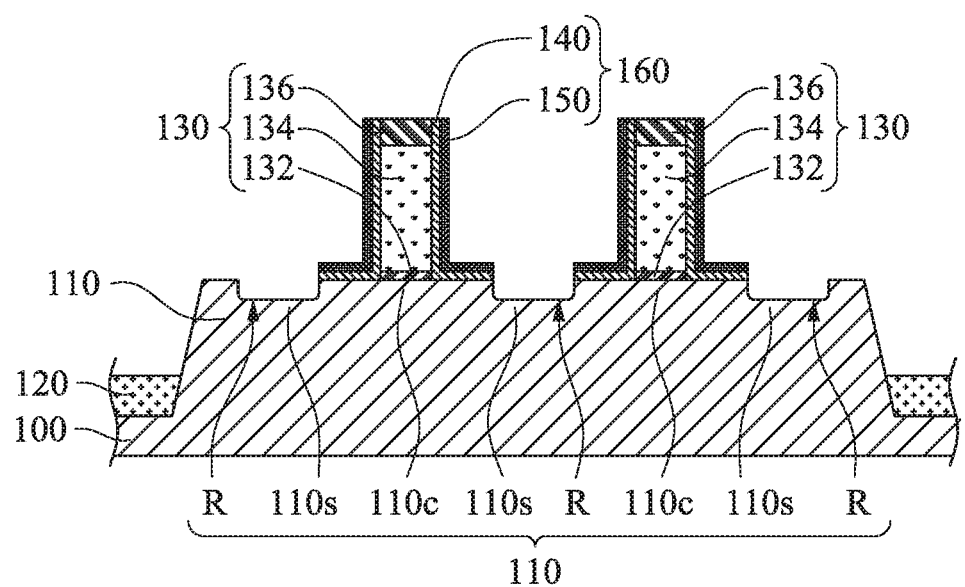

Reference is made to FIG. 5. Portions of the semiconductor fin 110 exposed by the dummy gate stacks 130 and the gate spacers 160 are removed (or recessed) to form recesses R in the semiconductor fin 110. Any suitable amount of material may be removed. The remaining semiconductor fin 110 has a plurality of source/drain portions 110s and a channel portion 110c between the source/drain portions 110s. Portions of the source/drain portions 110s are exposed by the recesses R. The channel portions 110c respectively underlie the dummy gate stacks 130.

Removing portions of the semiconductor fin 110 may include forming a photoresist layer or a capping layer (such as an oxide capping layer) over the structure of FIG. 4, patterning the photoresist or capping layer to have openings that expose portions of the semiconductor fin 110, and etching the exposed portions of the semiconductor fin 110. In some embodiments, the semiconductor fin 110 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses R and with HF or other suitable solution.

Figure 6:
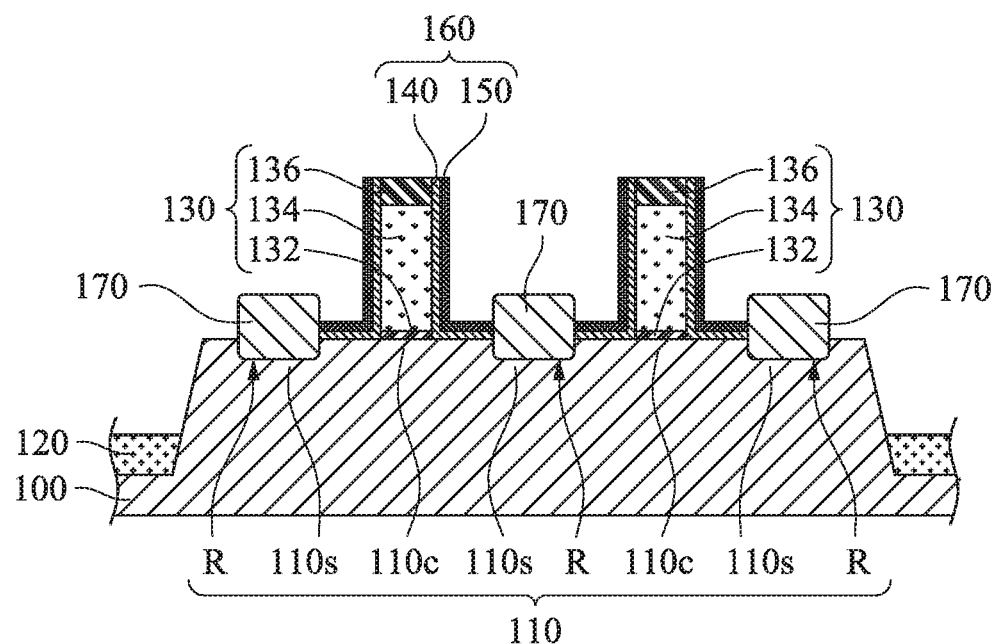

Reference is made to FIG. 6. A plurality of epitaxy structures 170 are respectively formed in the recesses R and on the source/drain portions 110s of the semiconductor fin 110. The epitaxy structures 170 may be formed using one or more epitaxy or epitaxial (epi) processes, such that Si features, SiGe features, and/or other suitable features can be formed in a crystalline state on the source/drain portions 110s of the semiconductor fin 110. In some embodiments, the lattice constants of the epitaxy structures 170 are different from the lattice constant of the semiconductor fin 110, so that the channel portions 110c of the semiconductor fin 110 can be strained or stressed by the epitaxy structures 170 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 110s of the semiconductor fin 110 (e.g., silicon). Thus, a strained channel can be achieved to increase carrier mobility and enhance device performance.

Figure 7:
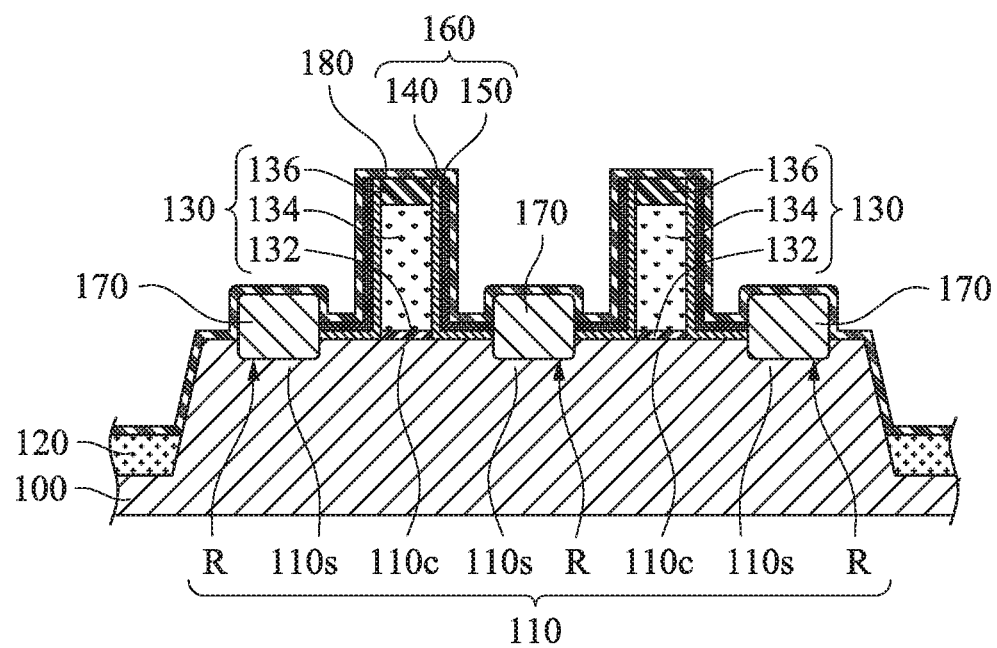

Reference is made to FIG. 7. A screening layer 180 is blanket formed on the structure shown in FIG. 6. That is, the screening layer 180 caps the semiconductor fin 110, the dummy gate stacks 130, the gate spacers 160 and the epitaxy structures 170. The screening layer 180 may be used for implantation screening and reduction of the channeling effect during the subsequent implantation. The screening layer 180 may be an oxide layer, ranging from about 10 angstroms to about 50 angstroms in thickness. Formation of the screening oxide layer 180 may exemplarily include deposition, such as PVD or CVD.

Figure 8:
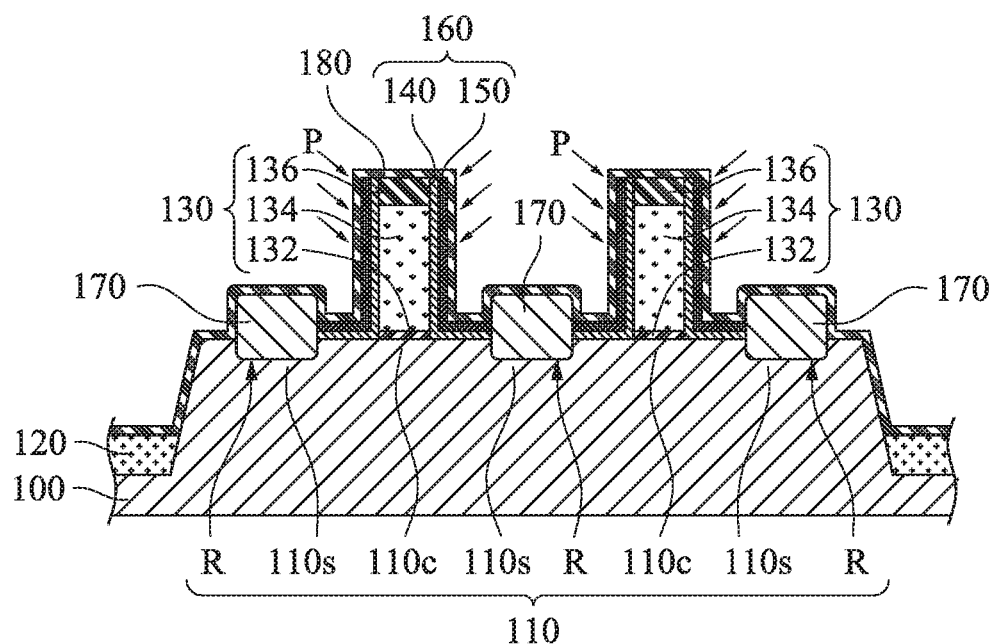

Reference is made to FIG. 8. A plasma treatment P is performed to the second dielectric layers 150 of the gate spacers 160. The plasma treatment P can cause depletion of carbon containing moieties within the surface region of the second dielectric layer 150. The depletion of carbon in the second dielectric layers 150 may be advantageous to improve a wet etching rate in its etchant, such as the dilute hydrofluoric acid (DHF). The plasma treatment P may include, for example, exposing the structure shown in FIG. 8 to a plasma environment, such as an oxygen plasma environment.

Next, an implantation process is performed to implant dopant into the epitaxy structures 170. The doping species may include p-type dopant, such as boron or $BF_2$; n-type dopant, such as phosphorus or arsenic; and/or other suitable dopant including combinations thereof. One or more annealing processes may be performed to activate the epitaxy structures 170. The annealing processes include rapid thermal annealing (RTA) and/or laser annealing processes.

Figure 9:
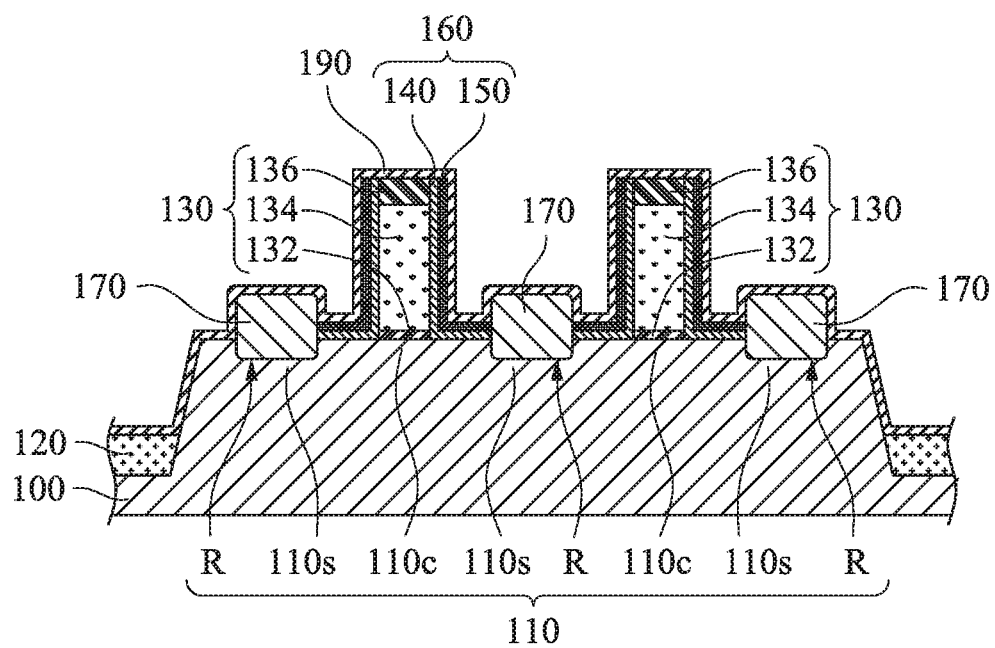

Reference is made to FIG. 9. The screening layer 180 shown in FIG. 8 is removed using, for example, an etching process, and a blanket third dielectric layer 190 is then formed on substrate 100. That is, the third dielectric layer 190 is formed on the semiconductor fin 110, the dummy gate stacks 130, the gate spacers 160 and the epitaxy structures 170. The third dielectric layer 190 may serve as an etch stop layer, especially a contact etch stop layer (CESL). The CESL may be made of silicon nitride, silicon oxynitride or other suitable materials. The third dielectric layer 190 may be formed by plasma enhanced CVD, low pressure CVD, ALD, or other applicable processes. In some embodiments, the second and third dielectric layers 150 and 190 include different dielectric materials with different etch properties. More particularly, the second and third dielectric layers 150 and 190 have different etch resistance properties. That is, the third dielectric layer 190 is made of a material which has higher etch resistance to the etchant used to etch the second dielectric layer 150. For example, the second dielectric layer 150 may include a porous dielectric material, and the third dielectric layer 190 may include a non-porous dielectric material.

Figure 10:
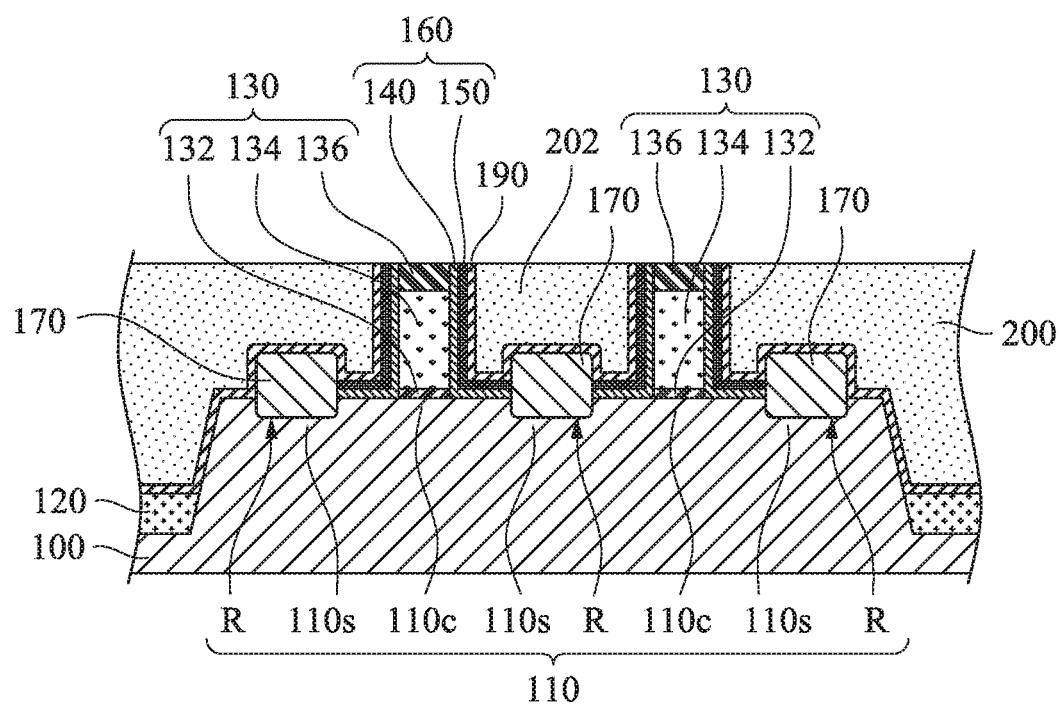

Thereafter, as shown in FIG. 10, an interlayer dielectric (ILD) layer 200 is formed on the substrate 100 the cover the semiconductor fin 110, the dummy gate stacks 130, the gate spacers 160 and the epitaxy structures 170. A portion of the ILD layer 200 may be formed between the dummy gate stacks 130 and may fill the remaining space between the dummy gate stacks 130, and this portion of the ILD layer 200 can be referred to as a filling dielectric 202 located between the dummy gate stacks 130. The ILD layer 200 includes silicon oxide, silicon nitride, silicon oxynitride, silicon carbide, low-k dielectric material or a combination thereof. The ILD layer 200 includes a single layer or multiple layers. The ILD layer 200 is formed by a suitable technique, such as CVD. Afterward, a chemical mechanical polishing (CMP) process may be applied to remove excessive ILD layer 200 and expose top surfaces of the dummy gate stacks 130 to a subsequent dummy gate removal process. Moreover, this CMP process also exposes tops of the first, second and third dielectric layers 140, 150, 190 and the ILD layer 200.

Figure 11:
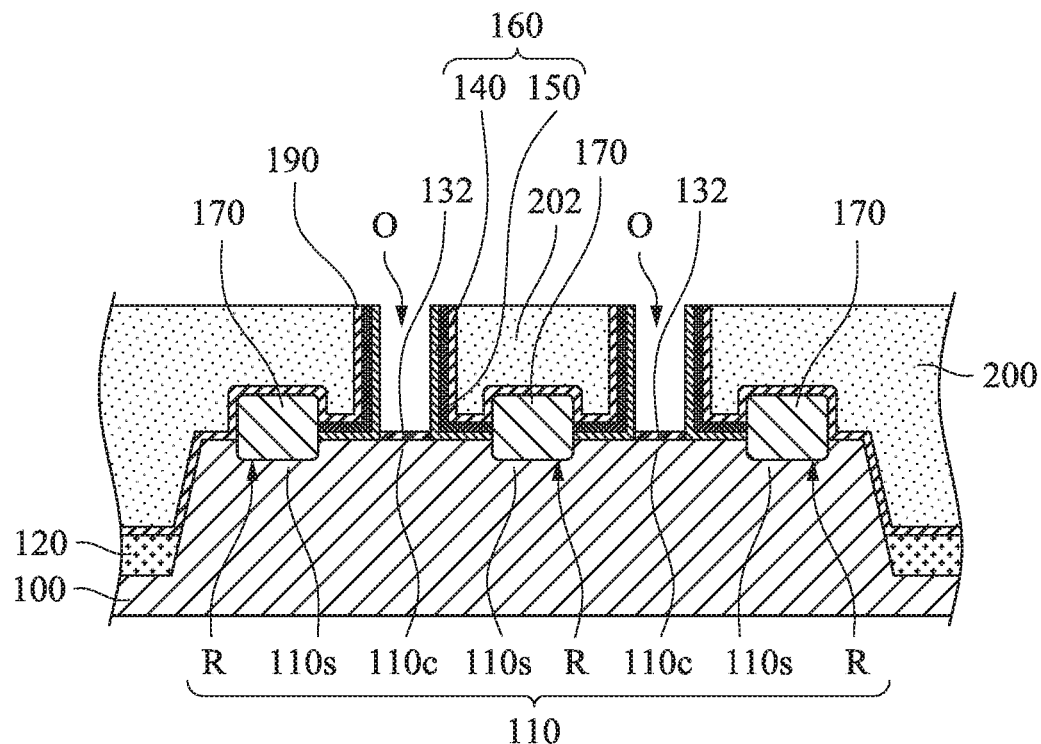

Reference is made to FIG. 11. At least portions of the dummy gate stacks 130 (see FIG. 10) are removed to form openings O with the gate spacers 160 as their sidewalls. In some embodiments, the dummy electrodes 134 and the gate masks 136 are removed while the gate dielectrics 132 retain as shown in FIG. 11. In the embodiments where the gate dielectrics 132 include high-k dielectric materials, the high-k gate dielectrics 132 are formed prior to the formation of the gate spacers 160, so that inner walls of the gate spacers 160 may not be blanket covered by high-k dielectric materials. This arrangement may be beneficial to reduce the parasitic capacitance between the subsequently formed gate stack and contact plug. Alternatively, in some other embodiments, the gate dielectrics 132 can be removed as well. The dummy gate stacks 130 may be removed by dry etching, wet etching, or a combination of dry and wet etching. For example, a wet etching process may include exposure to a hydroxide containing solution (e.g., ammonium hydroxide), deionized water, and/or other suitable etchant solutions. In some embodiments, the non-porous first dielectric layer 140 has higher etch resistance to the etching the dummy gate stacks 130 than that of the porous second dielectric layer 150, and therefore, the non-porous first dielectric layer 140 can protect the gate spacers 160 against the etching the openings O.

Figure 12:
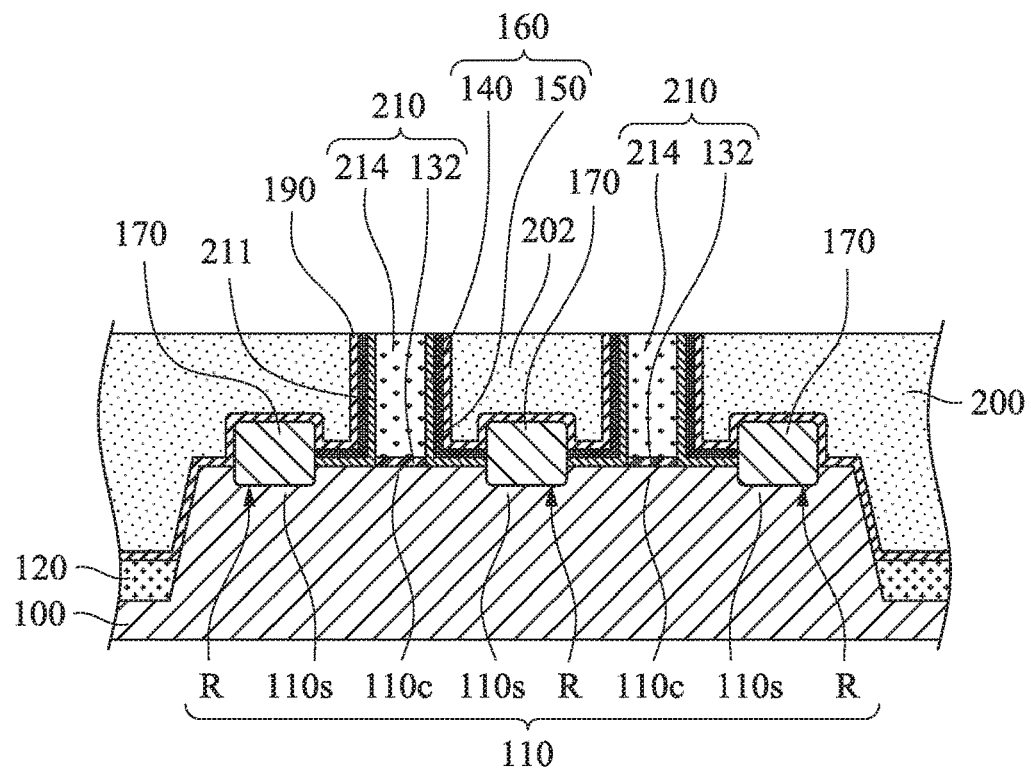

Reference is made to FIG. 12. Gate conductors 214 are respectively formed in the openings O between the gate spacers 160. The gate conductors 214 and the respective underlying gate dielectrics 132 can be collectively referred to as gate stacks 210. The gate stacks 210 straddle the semiconductor fin 110 and extend along the gate spacers 160. The gate spacers 160 are present on sidewalls 211 of the gate stacks 210. In some embodiments, the gate conductors 214 may include work function metals to provide suitable work functions for the gate stacks 210. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. On the other hand, if an N-type work function metal (N-metal) for NMOS devices is desired, N-type metal materials may be used. Examples of N-type work function materials include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The gate conductors 214 may further include filling metals located on the work function metals and filling recesses in the work function metals. The filling metals may include tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate conductors 214 may include blanket forming one or more work function metal layers over the structure shown in FIG. 11, forming filling metal over the work function metal layers, wherein some portions of the filling metal overfill the openings O shown in FIG. 11, and then performing a CMP process to remove excessive filling metal and work function metal layers outside the openings O.

Figure 13:
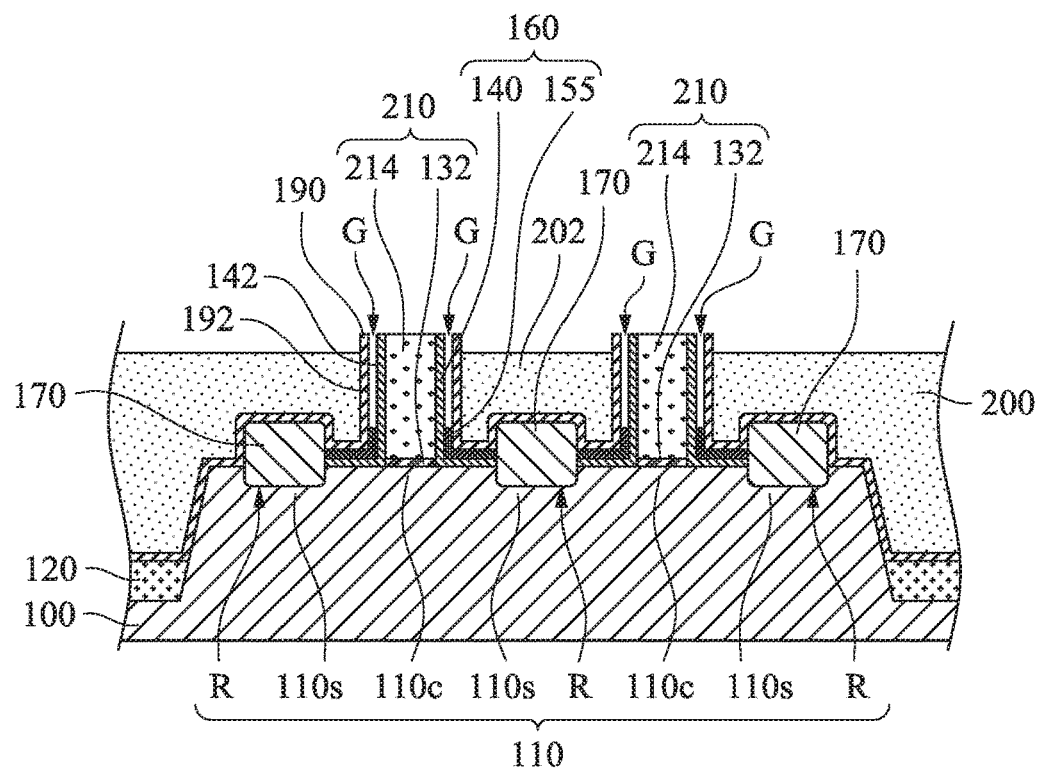

Reference is made to FIG. 13. At least a portion of the second dielectric layer 150 is removed. In particular, a top portion of the second dielectric layer 150 is removed, while underlying portions of the second dielectric layer 150 remain between the first dielectric layer 140 and the third dielectric layer 190, and the remaining portions of the second dielectric layer 150 can be referred to as a lowered dielectric layer 155. This removal process creates a gap G between the first and third dielectric layers 140 and 190. That is, sidewalls 142 and 192 of the first and third dielectric layers 140 and 190 are exposed due to the removal process. In other words, the removing the top portion of the second dielectric layer 150 leaves a gap G overlying the lowered dielectric layer 155, and the first and third dielectric layers 140 and 190 are separated at least by the gap G. That is, the gap G is located on a top of the lowered dielectric layer 155, or stated differently, the lowered dielectric layer 155 is located on a bottom of the gap G. The gap G may be a gas-containing or gas-filled space, especially an air-containing or air-filled space, and the gap G can thus be referred to as an air gap. Gas in the gap G may separate the first dielectric layer 140 and the third dielectric layer 190, and therefore, the gas, especially air, can provide a dielectric feature with extremely low dielectric constant (about 1) between the first and third dielectric layers 140 and 190, so that the parasitic capacitance between the gate stack 210 and a subsequently formed contact plug can be further reduced, and the RC time delay can be further decreased.

The etch property difference among the second dielectric layer 150 and the first and third dielectric layers 140 and 190 may benefit the formation of the gap G between the first and third dielectric layers 140 and 190. For example, the formation of the gap G may include an etching process, such as a wet etching process, a dry etching process or combinations thereof. During the etching process, an etch selectivity of the second dielectric layer 150 is higher than that of the first and third dielectric layers 140 and 190. Stated differently, the first and third dielectric layers 140 and 190 have higher etch resistances to the etchant used to etch the second dielectric layer 150. Accordingly, the first and third dielectric layers 140 and 190 are not easier to be etched or removed compared to the second dielectric layer 150 during this etching process. Therefore, a height difference between the lowered dielectric layer 155 and the first and third dielectric layers 140 and 190 are generated after the etching process, and the gap G is thus formed between the first and third dielectric layers 140 and 190 and atop the lowered dielectric layer 155. In some embodiments, the etchant used in this etching process may be dilute hydrofluoric acid (DHF), HF, or other suitable materials.

In some embodiments, the plasma treatment P performed in FIG. 8 causes depletion of carbon in the second dielectric layer 150, and this depletion of carbon may be advantageous to improve the wet etching rate of the second dielectric layer 150 in the DHF. The improved wet etching rate may be beneficial to create a deeper gap G between the first and third dielectric layers 140 and 190. The deeper the gap G is, the more the contained gas or air is. As such, the reduction of the parasitic capacitance between the gate stack 210 and the subsequently contact plug can be further enhanced due to the plasma treatment P.

In some embodiments, the removal process performed to the second dielectric layer 150 also removes a portion of the ILD layer 200, so that the ILD layer 200 has a top lower than that of the first and third dielectric layers 140 and 190. In other words, the filling dielectric 202 between the gate stacks 210 has a top lower than that of the first and third dielectric layers 140 and 190. In some embodiments, the removal process performed to the second dielectric layer 150 may also remove some portions of the first and third dielectric layers 140 and 190. The etch resistances of the first and third dielectric layers 140 and 190 to the etchant used to etch the second dielectric layer 150 are higher than that of the ILD layer 200. This etch resistance difference makes height loss of the ILD layer 200 greater than height losses of the first and third dielectric layers 140 and 190, and therefore, the ILD layer 200 can have the top lower than that of the first and third dielectric layers 140 and 190. In some embodiments, the ILD layer 200 has higher etch resistance to the etchant used to etch the second dielectric layer 150, and therefore, the height loss of the ILD layer 200 is less than that of the second dielectric layer 150. That is, the top of the ILD layer 200 is higher than that of the lowered dielectric layer 155. In some embodiments, ratio of the height loss of the ILD layer 200 to the height loss of the second dielectric layer 150 may be about 1:5. In some embodiments, the height loss of the second dielectric layer 150 may range from about 120 angstroms to about 180 angstroms. That is, height of the gap G may range from about 120 angstroms to about 180 angstroms. In some embodiments, the height loss of the ILD layer 200 may range from about 10 angstroms to about 50 angstroms. In some embodiments, portions of the gate stacks 210 may be removed due to the etching process performed to the second dielectric layer 150. The gate stacks 210 have higher etch resistance to the etchant used to etch the second dielectric layer 150, so that tops of the gate stacks 210 are higher than that of the lowered dielectric layer 155. In some embodiments, height losses of the gate stacks 210 due to this etching process may be less than about 10 angstroms.

Figure 14:
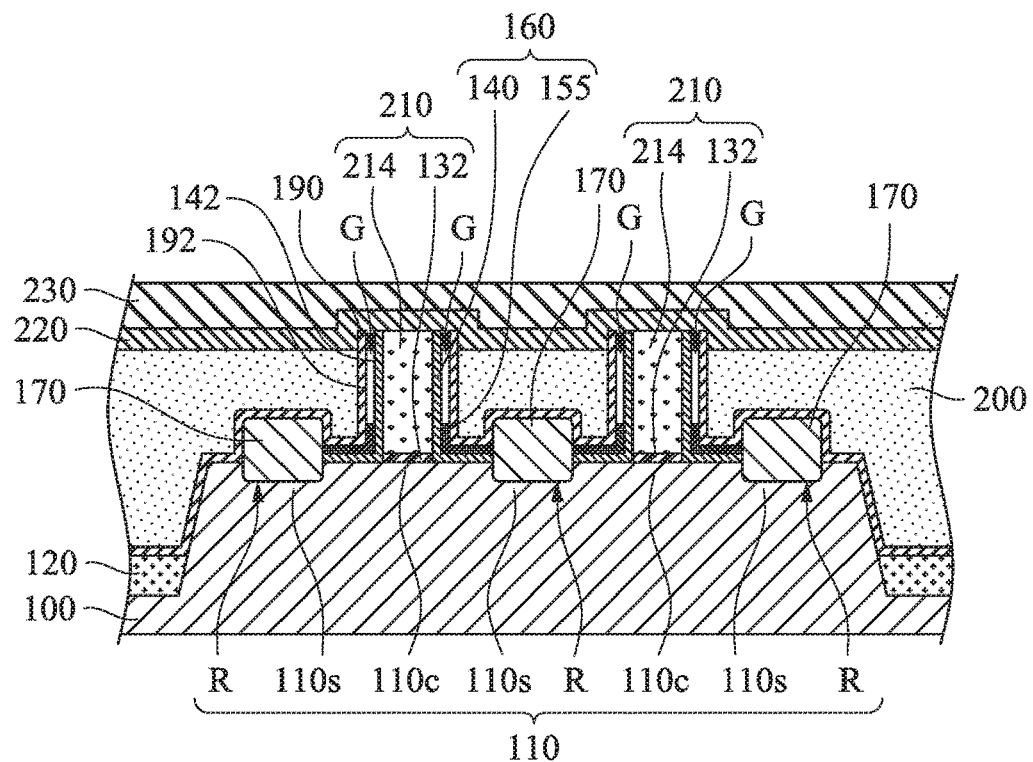

Reference is made to FIG. 14. A dielectric cap 220 is formed on the structure shown in FIG. 13. The dielectric cap 220 at least caps the gate spacers 160, and the gap G is located between the dielectric cap 220 and the lowered dielectric layer 155. That is, sidewalls 142 and 192 of the first and third dielectric layers 140 and 190 are not covered by the dielectric cap 220. In some embodiments, the dielectric cap 220 further caps the third dielectric layer 190, the gate stacks 210 and the ILD layer 200. The gap G can be thus sealed at least by the overlying dielectric cap 220, and gas in the gap G may separate the lowered dielectric layer 155 and the dielectric cap 220. In some embodiments, the dielectric cap 220 and the lowered dielectric layer 155 are respectively located on two opposite sides of the gap G, and the third dielectric layer 190 and the first dielectric layer 140 are respectively located on another two opposite sides, and the gap G can therefore be defined by the first and third dielectric layers 140 and 190, the lowered dielectric layer 155 and the dielectric cap 220. Stated differently, sidewalls 142 and 192 of the first and third dielectric layers 140 and 190, the top of the lowered dielectric layer 155, and a portion of a bottom of the dielectric cap 220 are exposed to the gap G. The dielectric cap 220 is advantageous to keep gas or air in the gap G. That is, the dielectric cap 220 is advantageous to prevent the gap G from being filled by unwanted materials. As such, the extremely low k dielectric feature formed by the gap G can be remained in the final product to reduce the parasitic capacitance. In some embodiments, a distance between the first and third dielectric layers 140 and 190 is short enough to prevent the dielectric cap 220 from filling the gap G. Stated differently, the gap G is narrow enough to prevent the dielectric cap 220 from filling the gap G after deposition of the dielectric cap 220. In some embodiments, the dielectric cap 220 has a thickness ranging from about 10 angstroms to about 50 angstroms. Exemplary method of forming the dielectric cap 220 may include CVD, PVD, or other suitable techniques.

In some embodiments, a gap may be absent between the top of the first dielectric layer 140 and the dielectric cap 220. For example, the top of the first dielectric layer 140 may be in contact with the dielectric cap 220. Similarly, a gap may be absent between the dielectric cap 220 and tops of the third dielectric layer 190, the ILD layer 200 and the gate stacks 210. That is, the tops of the third dielectric layer 190, the ILD layer 200 and the gate stacks 210 may be in contact with the dielectric cap 220. In other words, the gap G does not extend to between the dielectric cap 220 and the tops of the first and third dielectric layers 140 and 190, the ILD layer 200 and the gate stacks 210.

Next, another interlayer dielectric (ILD) layer 230 is formed on the dielectric cap 220. The ILD layer 230 includes silicon oxide, silicon nitride, silicon oxynitride, silicon carbide, low-k dielectric material or a combination thereof. The ILD layer 230 includes a single layer or multiple layers. The ILD layer 230 is formed by a suitable technique, such as CVD.

Figure 15:
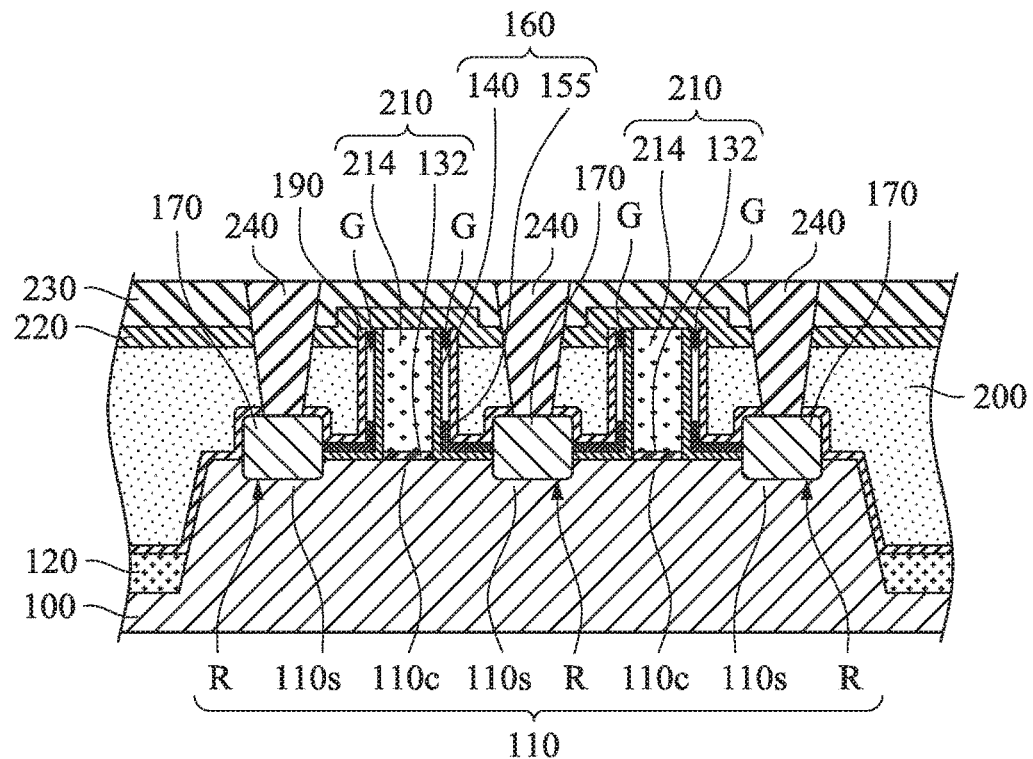

Reference is made to FIG. 15. Conductive features, such as contact plugs 240, are formed through the ILD layers 230 and 200, the dielectric cap 220 and the third dielectric layer 190, and they are in contact with tops of the epitaxy structures 170, respectively. The contact plugs 240 can thus serve as source/drain contacts. The gap G is located between the contact plug 240 and the gate stack 210, and therefore, the gap G can reduce the parasitic capacitance between the gate stack 210 and the contact plug 240, thereby decreasing the RC time delay. Further, the lowered dielectric layer 155 has the dielectric constant lower than the first dielectric layer 140, and the lowered dielectric layer 155 is located between the gate stack 210 and the contact plug 240. Therefore, the lowered dielectric layer 155 is also beneficial to reduce the parasitic capacitance between the gate stack 210 and the contact plug 240, thereby decreasing the RC time delay.

Exemplary formation method of the contact plugs 240 may include forming contact holes by one or more etching processes to sequentially etch through the ILD layer 230, the dielectric cap 220 and the ILD layer 200 down to the respective epitaxy structures 170, and depositing metal or other suitable conductive materials in the contact holes by a deposition process, such as a CVD process, to form the contact plugs 240.

In some embodiments, there is a gap between the contact plug and the gate stack of the semiconductor device. The gap is advantageous to reduce the parasitic capacitance between the gate stack and the contact plug. The RC time delay can be decreased, accordingly. Moreover, the gap is located on a lowered dielectric layer having an etch property different from that of a dielectric layer adjacent to the gate stack. Therefore, the gap can be formed by an etching process, in which the dielectric layer adjacent to the gate stack has higher etch resistance to the etchant to etch the lowered dielectric layer. Further, the lowered dielectric layer has lower dielectric constant compared to the dielectric layer adjacent to the gate stack, so the parasitic capacitance between the gate stack and the contact plug can be further reduced.

According to some embodiments, a semiconductor device includes a semiconductor substrate, at least one gate stack, a gate spacer and a dielectric cap. The gate stack is located on the semiconductor substrate. The gate spacer is located on a sidewall of the gate stack. The gate spacer includes a first dielectric layer and a second dielectric layer with different etch properties. The dielectric cap at least caps the gate spacer. The dielectric cap and the second dielectric layer define a gap therebetween.

According to some embodiments, a semiconductor device includes a semiconductor substrate, at least one gate stack, a gate spacer and a third dielectric layer. The gate stack is located on the semiconductor substrate. The gate spacer is located on a sidewall of the gate stack. The gate spacer includes a first dielectric layer and a second dielectric layer. The third dielectric layer is located on the semiconductor substrate. The third dielectric layer and the first dielectric layer are separated at least by a gap. The second dielectric layer is located on a bottom of the gap.

According to some embodiments, a method of forming a semiconductor device includes forming a gate spacer on a semiconductor substrate, the gate spacer including a first dielectric layer and a second dielectric layer located on the first dielectric layer; forming a gate stack adjacent to the first dielectric layer of the gate spacer; removing at least a portion of the second dielectric layer such that a sidewall of the first dielectric layer is exposed; and forming a dielectric cap on the gate spacer, wherein at least a portion of the sidewall of the first dielectric layer is not covered dielectric cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a gate stack on the semiconductor substrate;
   a gate spacer on a sidewall of the gate stack, the gate spacer comprising a first dielectric layer and a second dielectric layer that has a dielectric constant less than that of the first dielectric layer, the first dielectric layer located between the second dielectric layer and the gate stack;
   a third dielectric layer surrounding the first and second dielectric layers; and
   a dielectric cap capping the first, second, and third dielectric layers, wherein the dielectric cap and the first, second, and third dielectric layers define an air gap therebetween, the first dielectric layer is further located between the second dielectric layer and the semiconductor substrate and extends to the dielectric cap, and the air gap is located on a top of the second dielectric layer.

2. The semiconductor device of claim 1, wherein the air gap separates the second dielectric layer and the dielectric cap.

3. The semiconductor device of claim 1, wherein the top of the second dielectric layer is lower than that of the first dielectric layer.

4. The semiconductor device of claim 1, further comprising:
   a conductive feature on the semiconductor substrate, the air gap being located between the conductive feature and the gate stack.

5. The semiconductor device of claim 1, further comprising:
   a conductive feature on the semiconductor substrate, the second dielectric layer being located between the conductive feature and the gate stack.

6. The semiconductor device of claim 1, wherein the second dielectric layer is a porous dielectric layer.

7. The semiconductor device of claim 1, further comprising:
   a filling dielectric surrounding the gate stack and having a top lower than that of the first dielectric layer.

8. The semiconductor device of claim 7, wherein the top of the filling dielectric is higher than that of the second dielectric layer.

9. The semiconductor device of claim 1, wherein the dielectric cap is in contact with opposite sidewalls of the third dielectric layer.

10. A semiconductor device, comprising:
    a semiconductor substrate;
    a gate stack on the semiconductor substrate;
    a gate spacer on a sidewall of the gate stack, the gate spacer comprising a first dielectric layer and a second dielectric layer;
    an epitaxy structure on the side of the gate stack; and
    a third dielectric layer on the semiconductor substrate, the third dielectric layer and the first dielectric layer being separated by an air gap, the second dielectric layer being in contact with a sidewall of the epitaxy structure and located between a bottom of the air gap and the first dielectric layer, and the third dielectric layer being in contact with a top surface of the epitaxy structure.

11. The semiconductor device of claim 10, wherein the air gap has gas therein, and the gas separates the first dielectric layer and the third dielectric layer.

12. The semiconductor device of claim 10, wherein the first dielectric layer is further located between the air gap and the gate stack.

13. The semiconductor device of claim 10, wherein the first dielectric layer is in contact with the sidewall of the epitaxy structure.

14. The semiconductor device of claim 10, wherein a topmost surface of the second dielectric layer is lower than a top surface of the gate stack.

15. A semiconductor device comprising:
    a substrate;
    a gate stack above the substrate; and
    a gate spacer on a sidewall of the gate stack and including first, second, and third dielectric layers, wherein the second dielectric layer is between the first and third dielectric layers, a sidewall of the first dielectric layer, a sidewall of the third dielectric layer, and a topmost surface of the second dielectric layer define an air gap and a bottom surface of the third dielectric layer is over a bottom surface of the first dielectric layer, and an epitaxy structure above the substrate, wherein the second dielectric layer is in contact with the epitaxy structure.

16. The semiconductor device of claim 15, further comprising an epitaxial structure over the substrate, wherein the first dielectric layer is on a sidewall of the epitaxial structure.

17. The semiconductor device of claim 15, further comprising an epitaxial structure over the substrate, wherein the second dielectric layer is on a sidewall of the epitaxial structure.

18. The device of claim 15, further comprising an epitaxial structure over the substrate, wherein the third dielectric layer is on opposite sidewalls of the epitaxial structure.

19. The device of claim 15, further comprising a fin above the substrate, wherein the second dielectric layer is on a sidewall of the fin.

20. The semiconductor device of claim 15, further comprising a dielectric cap in contact with the gate stack and the first and third dielectric layers.

* * * * *